(12) United States Patent  
Mohanty et al.

(10) Patent No.: US 8,772,999 B2
(45) Date of Patent: Jul. 8, 2014

(54) SIGNAL AMPLIFICATION BY HIERARCHAL RESONATING STRUCTURES

(75) Inventors: Pritiraj Mohanty, Los Angeles, CA (US); Alexei Gaidarzhy, Brighton, MA (US); Guiti Zolfagharkhani, Brighton, MA (US); Fardad Hashemi, Boston, MA (US)

(73) Assignee: Sand 9, Inc., Cambridge, MA (US)

( * ) Notice: Subject to any disclaimer, the term of this patent is extended or adjusted under 35 U.S.C. 154(b) by 826 days.

(21) Appl. No.: 12/681,428

(22) PCT Filed: Oct. 11, 2007

(86) PCT No.: PCT/US2007/081040
§ 371 (c)(1),
(2), (4) Date: Feb. 10, 2011

(87) PCT Pub. No.: WO2009/048468
PCT Pub. Date: Apr. 16, 2009

(65) Prior Publication Data
US 2011/0121682 A1   May 26, 2011

(51) Int. Cl.
*H02N 1/00* (2006.01)
*H03B 5/30* (2006.01)

(52) U.S. Cl.
USPC .......................... 310/309; 331/116; 331/154

(58) Field of Classification Search
USPC ................. 310/309; 331/154, 116; 73/504.04
See application file for complete search history.

(56) References Cited

U.S. PATENT DOCUMENTS

| | | | |
|---|---|---|---|
| 5,327,104 A | 7/1994 | Kikushima | |
| 5,640,133 A | 6/1997 | MacDonald et al. | |
| 5,914,553 A * | 6/1999 | Adams et al. | 310/309 |
| 6,041,600 A | 3/2000 | Silverbrook | |
| 6,124,765 A | 9/2000 | Chan et al. | |
| 6,424,074 B2 | 7/2002 | Nguyen | |
| 6,577,040 B2 | 6/2003 | Nguyen | |
| 6,710,680 B2 | 3/2004 | Niu et al. | |
| 6,734,762 B2 | 5/2004 | Cornett et al. | |
| 6,763,340 B1 * | 7/2004 | Burns et al. | 706/26 |
| 6,828,713 B2 | 12/2004 | Bradley et al. | |

(Continued)

FOREIGN PATENT DOCUMENTS

WO   WO 98/01948 A1   1/1998
WO   WO 98/37635 A1   8/1998

(Continued)

OTHER PUBLICATIONS

Adams, S., et al., "Independent Tuning of Linear and Nonlinear Stiffness Coefficients", Journal of Microelectromechanical Systems, vol. 7, No. 2, Jun. 1, 1998, pp. 172-180.

(Continued)

*Primary Examiner* — Thomas Dougherty
(74) *Attorney, Agent, or Firm* — Wolf, Greenfield & Sacks, P.C.

(57) ABSTRACT

An electromechanical resonating structure, including: first level major elements coupled to each other to form a second or higher level hierarchy; and first level sub-micron size minor elements with a characteristic frequency and coupled to each of the first level major elements to form a second level hierarchy in which a signal is effectively amplified by vibrating each of the plurality of major elements in at least one mode determined by the geometry and dimensions of the first level sub-micron minor elements.

17 Claims, 20 Drawing Sheets

(56) References Cited

U.S. PATENT DOCUMENTS

| | | | |
|---|---|---|---|
| 6,831,531 B1 | 12/2004 | Giousouf et al. | |
| 6,859,113 B2 * | 2/2005 | Giousouf et al. | 331/154 |
| 6,861,914 B2 | 3/2005 | Photiadis et al. | |
| 6,894,576 B2 * | 5/2005 | Giousouf et al. | 331/154 |
| 6,909,221 B2 | 6/2005 | Ayazi et al. | |
| 6,930,569 B2 * | 8/2005 | Hsu | 333/186 |
| 6,943,484 B2 | 9/2005 | Clark et al. | |
| 6,954,020 B2 | 10/2005 | Ma et al. | |
| 6,966,224 B2 * | 11/2005 | Yan et al. | 73/504.14 |
| 6,995,622 B2 | 2/2006 | Partridge et al. | |
| 7,005,946 B2 | 2/2006 | Duwel et al. | |
| 7,211,926 B2 | 5/2007 | Quevy et al. | |
| 7,215,061 B2 | 5/2007 | Kihara et al. | |
| 7,248,128 B2 | 7/2007 | Mattila et al. | |
| 7,274,002 B2 * | 9/2007 | Stewart | 219/209 |
| 7,352,608 B2 | 4/2008 | Mohanty et al. | |
| 7,358,822 B2 | 4/2008 | Aubin et al. | |
| 7,492,241 B2 | 2/2009 | Piazza et al. | |
| 7,504,909 B2 | 3/2009 | Tada | |
| 7,545,239 B2 | 6/2009 | Hagelin et al. | |
| 7,584,649 B2 * | 9/2009 | Shaw et al. | 73/31.06 |
| 7,724,103 B2 | 5/2010 | Feng et al. | |
| 7,791,432 B2 | 9/2010 | Piazza et al. | |
| 8,258,893 B2 * | 9/2012 | Quevy et al. | 333/186 |
| 2001/0006357 A1 | 7/2001 | Yamamoto | |
| 2002/0113191 A1 | 8/2002 | Rolt et al. | |
| 2004/0113722 A1 | 6/2004 | Bircumshaw et al. | |
| 2004/0207492 A1 | 10/2004 | Nguyen et al. | |
| 2005/0061073 A1 * | 3/2005 | Kanna et al. | 73/504.04 |
| 2005/0073078 A1 | 4/2005 | Lutz et al. | |
| 2005/0140467 A1 * | 6/2005 | Duwel et al. | 333/189 |
| 2007/0024159 A1 * | 2/2007 | Koji | 310/321 |
| 2007/0188254 A1 | 8/2007 | Sutardja | |
| 2008/0143217 A1 | 6/2008 | Ho et al. | |
| 2008/0204153 A1 | 8/2008 | Yoshida et al. | |
| 2008/0272852 A1 | 11/2008 | Six | |
| 2009/0108381 A1 | 4/2009 | Buchwalter et al. | |
| 2009/0108959 A1 | 4/2009 | Piazza et al. | |
| 2009/0144963 A1 | 6/2009 | Piazza et al. | |
| 2009/0267699 A1 | 10/2009 | Mohanty et al. | |
| 2009/0267700 A1 | 10/2009 | Mohanty et al. | |
| 2009/0294638 A1 | 12/2009 | Mohanty et al. | |
| 2010/0007443 A1 * | 1/2010 | Mohanty et al. | 333/188 |
| 2010/0134207 A1 | 6/2010 | Mohanty et al. | |
| 2010/0155883 A1 | 6/2010 | Wenzler et al. | |

FOREIGN PATENT DOCUMENTS

| | | | |
|---|---|---|---|
| WO | WO 02/17481 A2 | 2/2002 | |
| WO | WO 2004/027796 A2 | 4/2004 | |
| WO | WO 2006/000611 A1 | 1/2006 | |
| WO | WO 2006/083482 A2 | 8/2006 | |
| WO | WO-2006-083482 A2 * | 8/2006 | H01L 27/12 |
| WO | WO 2010/011288 A1 | 1/2010 | |

OTHER PUBLICATIONS

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

International Search Report and Written Opinion for International Application No. PCT/US07/81040 mailed Mar. 20, 2008.

International Search Report and International Preliminary Report on Patentability for PCT/US2006/021298 mailed Nov. 6, 2006 and Dec. 6, 2007 respectively.

International Search Report and Written Opinion from PCT/US2006/000401 mailed Oct. 16, 2006.

Lee, S., et al., "Mechanically-Coupled Micromechanical Resonator Arrays for Improved Phase Noise", IEEE Frequency Control Symposium and Exposition, Proceedings 2004, Aug. 23, 2004, pp. 144-150.

Neuzil, P., et al., "Air flow actuation of micromechanical oscillators", Applied Physics Letters, vol. 79, No. 1, Jul. 2, 2001, pp. 138-140.

Nguyen, C., "Vibrating RF MEMS for Next Generation Wireless Applications", IEEE Custom Integrated Circuits Conference 2004, Oct. 3, 2004, pp. 257-264.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

Supplementary European Search Report and Opinion from European Application No. 06733632.1, mailed May 6, 2009.

* cited by examiner

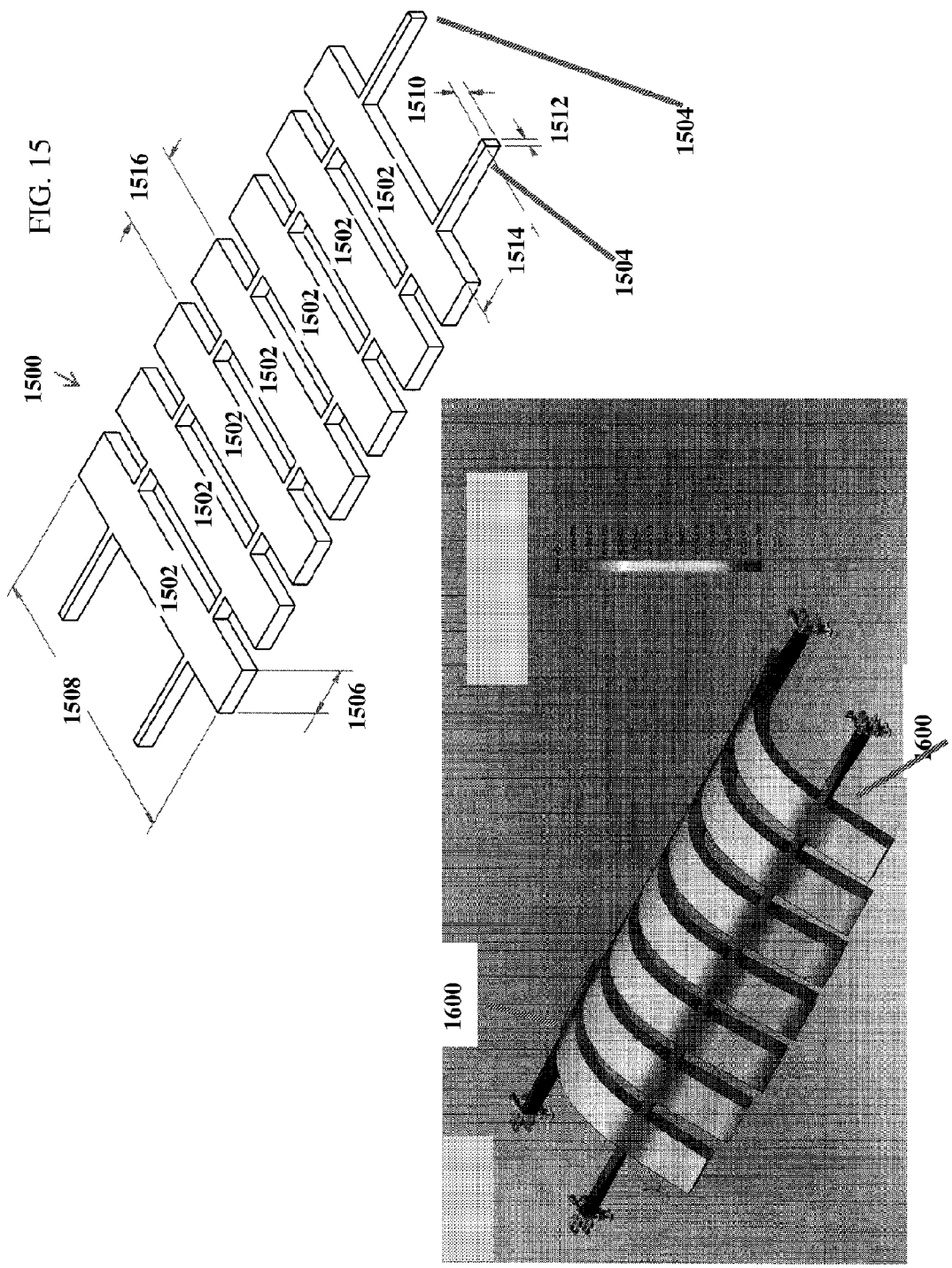

SIGNAL AMPLIFICATION BY HIERARCHAL RESONATING STRUCTURES

RELATED APPLICATIONS

This application is a U.S. National Stage patent application based on International Application No. PCT/US2007/081040, filed Oct. 11, 2007, which is incorporated herein by reference in its entirety.

TECHNICAL FIELD OF THE INVENTION

The present invention relates generally to electromechanical structures at the nanometer scale and specifically, to signal amplification by a hierarchy of resonating structures.

BACKGROUND OF THE INVENTION

Current wireless electronics systems rely on a series of radiofrequency (RF) and intermediate frequency (IF) filters in order to isolate the desired communications channel from the crowded and noisy background. Currently, surface acoustic wave (SAW), bulk acoustical wave (BAW), film bulk acoustic resonator (FBAR) and ceramic filters are the devices of choice. However, in general, these filters are large, bulky, expensive and discretely packaged components that cannot be integrated with the rest of the transceiver architecture. Other components in the front-end module that can be made with the current invention such as frequency mixers, duplexers, switches, oscillators and converters are also relatively bulky, expensive and discreetly packaged. While the front-end module of the transceiver can and does continue to miniaturize with improving lithographic processes and designs, the filter stands as the bottleneck to a truly integrated radio package.

More and more, a greater number of communications standards (GSM, CDMA, PCS, European/US, UMTS) and features (WiFi, cameras) are being incorporated into a single handset. While this allows for truly global communications, it comes at the cost of a larger and more power-hungry device. Adding more bands and modes means that more and more discrete packages are added onboard, with corresponding increases in overall board size and power consumption due to package-to-package signal losses.

Therefore, a need exists for type of electrical elements that are small in size, utilize minimal power and can be integrated with other discrete electrical elements.

BRIEF SUMMARY OF THE INVENTION

The present invention discloses a novel hierarchy of electromechanical resonators at the nanometer scale. With hierarchical network designs, it is possible to create a large net response in which the mechanical characteristics of the small-scale first-level elements such as resonance frequency are transferred to next-level larger-scale elements. By suitably designing features, phase coherent signals from a set of small-scale first-level elements can be transferred to the next level in the hierarchy where the coherent sum of the signal serves as an amplification factor. By stacking both the number of elements in a given hierarchy and the number of hierarchical levels, large mechanical signal amplification can be achieved even at ultra-high frequencies. Furthermore, it is possible to excite non-dissipative modes in a hierarchical network which can be used for signal propagation without energy loss. The design of the network can also enable directionality in the mechanical wave propagation. Embodiments of the present invention include specific device designs based on hierarchical and non-hierarchical networks.

An embodiment of the present invention includes a hierarchical design of a mechanical structure that enables the transfer of the mechanical response of the smallest element in the structure (sub-micron or nanometer scale, corresponding to a resonance frequency scale in the gigahertz range) across multiple length scales in the tens to hundreds of microns. Specific design attributes result in microscopic oscillation or resonance of the structure at resonance frequencies determined by the smallest element. Furthermore, inclusion of a large number of phase coherent elements in the first-level hierarchy allows amplification of the net mechanical signal to the next-level hierarchy. Because of multiple levels of hierarchy, these designer structures can demonstrate higher tensile strength, broader dynamic range of elasticity and higher rupture energy than its constituting material. Electromechanical devices built with specific hierarchical structures can therefore demonstrate mechanical behavior beyond characteristic material limits. Furthermore, hierarchical designs can be used for temperature compensation or to correct for process variation.

An embodiment of the present invention includes an electromechanical resonating structure. The structure includes: first level major elements coupled to each other to form a third level hierarchy; and first level sub-micron size minor elements with a characteristic frequency and coupled to each of the first level major elements to form a second level hierarchy in which a signal is effectively amplified by vibrating each of the plurality of major elements in at least one mode determined by the geometry, dimensions and material properties of the first level sub-micron minor elements.

The use of a hierarchy of nano electromechanical resonators of the present invention allows for several advantages, including the ability to integrate such a device on a semiconductor chip with the rest of the transceiver architecture. Such a device could be used, for example, as a filter. In the example of a filter, removing the 10-20 discrete filter packages in a typical multimode phone and replacing them with a single IC package is a huge advantage. Additionally, the ability to integrate the filters onto the same chip as the RFIC allows for even more space and power savings. It will also allow for a single device to be sensitive to all relevant government, commercial and military communications bands. Additionally, such a filter's small size allows for the replacement of the RF/IF heterodyning structure of the modern architecture with a tunable direct-channel-select filtering scheme, encompassing hundreds or thousands of individual filters. Among the advantages would be a fully integrated RF transceiver chip, drastically reducing production costs, RF board space, and power consumption. Additionally, a single RF transceiver would be capable of communicating on any band, in any channel, from 10 MHz up to 100 GHz or more. The transceiver could work in all of the cellular communications bands (such as, but not limited to, GSM, CDMA, PCS, UMTS), wireless data bands (such as, but not limited to, WiFi, EDGE, etc.), peripherals bands (such as, but not limited to, Bluetooth), satellite radio, GPS and other types of communication and/or electrical implementations. Moreover, additional example uses of the hierarchy of nano electromechanical resonators include, but are not limited too, mixers, duplexers, oscillators, switches and other types of circuit elements.

The following description and drawings set forth in detail a number of illustrative embodiments of the invention. These embodiments are indicative of but a few of the various ways in which the present invention may be utilized.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 15 illustrates an alternate second level structure;

FIG. 16 illustrates how the alternate second level structure might vibrate;

DETAILED DESCRIPTION OF THE INVENTION

Figure 2:
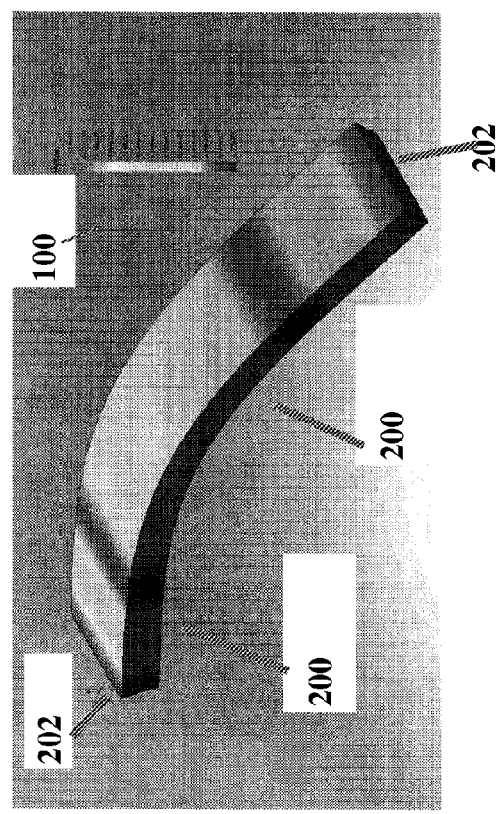
FIG. 2 illustrates how a first level structure might vibrate.

The following discussion is presented to enable a person skilled in the art to make and use the invention. The general principles described herein may be applied to embodiments and applications other than those detailed below without departing from the spirit and scope of the present invention as defined herein. The present invention is not intended to be limited to the embodiments shown, but is to be accorded the widest scope consistent with the principles and features disclosed herein.

Hierarchical structures are complex systems in which there are multiple length scales or system sizes often arranged in a particular hierarchy. Even though many systems with multiple scales are known to exist from cosmological scales down to atomic sizes, hierarchical structures are fundamentally different in that the levels and complexity of the hierarchy in these structures determine the system behavior. In contrast, normal scale invariant structures do not necessarily inherit their physical and statistical behavior from the hierarchy itself.

One of the fascinating examples of hierarchical structure is the keratinous hair called setae found on gecko's feet. Under a scanning electron microscope, the hair follicles demonstrate multiple length scales as seen in many systems with scale-invariant self-similarity. However, it is believed that the hierarchy of length scales and the levels of hierarchy in the setae of a gecko's feet determine robust and releasable adhesion. Similar structural hierarchy is also believed to be the origin of bone strength.

In addition, synaptic activity in sensory processing in the human brain is thought to contain hierarchical organization of oscillatory behavior in the neuronal ensemble. Frequency bands in the electroencephalographic (EEG) oscillations demonstrate an underlying structure reflected in the spatial scale and the frequency-domain characteristics. In the EEG oscillatory hierarchy, delta phase (1-4 Hz) modulates theta (4-10 Hz) amplitude, and theta phase modulates gamma (30-50 Hz) amplitude. The main point of these two examples is that the behavior of the smallest scale in the structural hierarchy (as in the setae in gecko's feet) is transported across scale to provide a robust macroscopic behavior in the largest scale.

Perhaps the most closely related example of structural hierarchy involves spider capture silk. Its web frame with concentric polygons is a hierarchical structure. Even though it is much softer, the tensile strength per unit weight of capture silk is comparable to that of steel, and more importantly, capture silk is at least an order of magnitude more extensible than steel. In other words, the hierarchical structure of the capture silk web frame can extend ten times the size of its relaxed length scale. Its rupture energy per unit length is 20 times higher than high-tensile steel. Finally, this hierarchy structure demonstrates exponential dependence between extension and applied force. This unusual logarithmic force-extension dependence allows a large dynamic range of its elastic properties.

With hierarchical structure designs, it is possible to amplify the mechanical response of a device, and hence reduce motional impedance of the device to an electromechanical or mechanical input while also reducing insertion loss. The design approach in the above examples involves one level of amplification from a plurality of first-level smaller-scale elements to a second-level larger-scale element. These example designs focus on collective modes in which the second-level larger element resonates at a frequency determined by the first-level smaller elements. This present invention focuses on a hierarchy of scale in which the resonant response is determined by the smallest scale in the hierarchy. The amplitude of the response is then determined by amplification provided by successive scales. In addition, fundamental advantages of scale invariance and self similarity are captured in a multi-scale hierarchical and non-hierarchical network design as illustrated through the embodiments of the present invention.

In other words, a physical property of a hierarchal structure (frequency in this case) generated at the smallest scale is translated across multiple scales of hierarchy so that the entire structure (on a much larger scale) retains that property (frequency). This happens to be a method of signal amplification as well.

Figure 1:
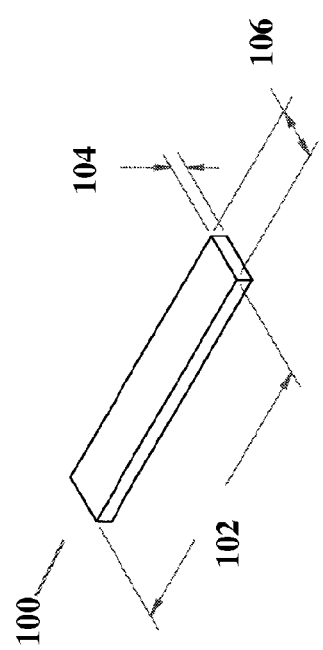
FIG. 1 illustrates a first level structure of an embodiment of the present invention.

As a simple example, a linear hierarchy of scales is described in the first embodiments. More complicated hierarchies are discussed in later embodiments. In FIG. 1, one level of hierarchy is displayed starting with a level one element 100. Appropriate boundary conditions determine the resonance frequency and the elastic response, which depend also on the geometry (shape, length L, width w, and thickness t) and material properties (materials density $\rho$ and elastic modulus E) of the level one element 100. In addition, the level one element 100 fundamental mode sets the desired frequency of collective modes of subsequent levels in the hierarchy. In this example, the material used was silicon with E=950 GPa, a Poisson's Ratio of 0.07, and density=3550 kg/(m^3) and the length 102 of the level one element 100 is 5500 nm, while the thickness 104 is 300 nm and the width 106 is 1000 nm. This example produces a fundamental frequency response of 165 MHz.

FIG. 2 illustrates how the level one element 100 vibrates. An observation of the vibration of the level one element is that two areas 200 of element 100 are minimally displaced, while other areas 202 are greatly displaced. The two areas 200 of least displacement occur in this example at about a fourth and about three fourths of the corresponding beam length.

Figure 3:
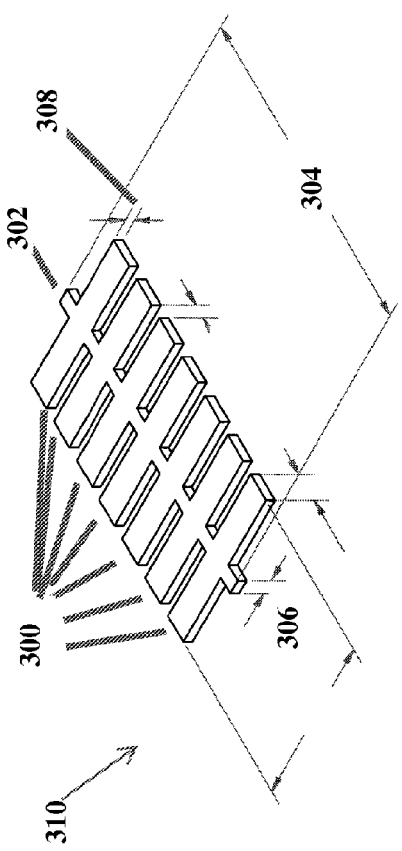
FIG. 3 illustrates a set of first level structures that forms a second level.

FIG. 3 illustrates the next level of hierarchy 310. This second level 310 includes two sets of elements. The first set of elements 300 is similar to the level one element 100 in FIG. 1. However, in this example, the level one elements 300 connect to a central beam 302 of a different geometry (length 304 is 11200 nm, width 306 is 500 nm and thickness 308 is 300 nm). In a collective mode, the phase coherent displacement or strain of the level-one elements 300 force the central beam 302 to move at the frequency determined by the level-one elements. In other words, phase-coherent high-frequency motion of the smaller-scale level-one elements determines the motion of the larger-scale level-two element. If the number of level-one elements is higher, then the net resulting strain of the level-two element is higher.

Figure 4:
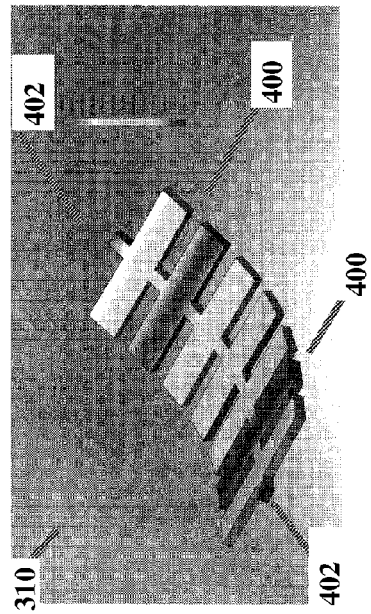
FIG. 4 illustrates how the second level might vibrate.

FIG. 4 illustrates a fundamental frequency response mode of the second level 310. In this example, the second level has a fundamental frequency response of 19 MHz. Note that this level of hierarchy also has some areas 400 that are displaced less than other areas 402 in this fundamental frequency response mode.

Figure 5:
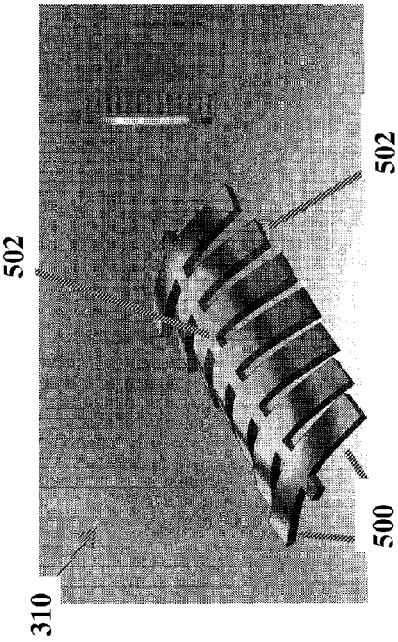
FIG. 5 illustrates an alternate form of vibration for the second level.

FIG. 5 illustrates a collective of the fundamental frequency response of the first level. In this example, the collective frequency response is 162 MHz. Note that this collective frequency response is similar to the fundamental frequency response of the level one element 100 shown in FIGS. 1 and 2. In addition, the collective response also results in some areas 500 that are displaced less than other areas 502.

Figure 6:
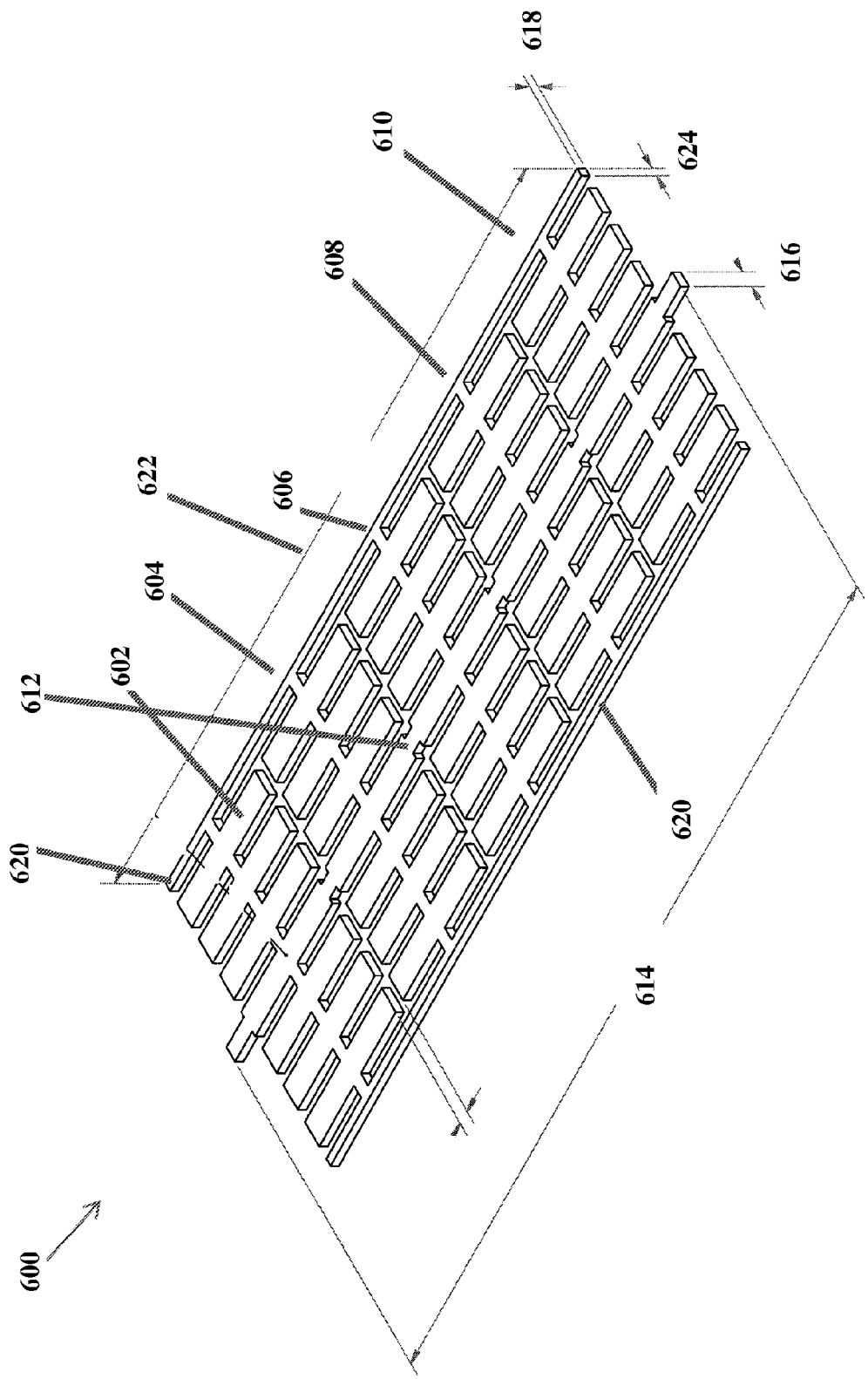
FIG. 6 illustrates a set of second level structures that form a third level.

FIG. 6 illustrates a third level hierarchy 600. In this example, five second level elements 602, 604, 606, 608 and 610 (with the underlying first level elements) are used to generate the third level hierarchy 600 at a different length scale. In this example, central beam 612 has dimensions of: length 614 of 3200 nm, width 616 of 600 nm and thickness 618 of 300 nm. In addition, the length 622 of the coupling elements 620 is 29500 while the width 624 is 300 nm in this example.

Figure 7:
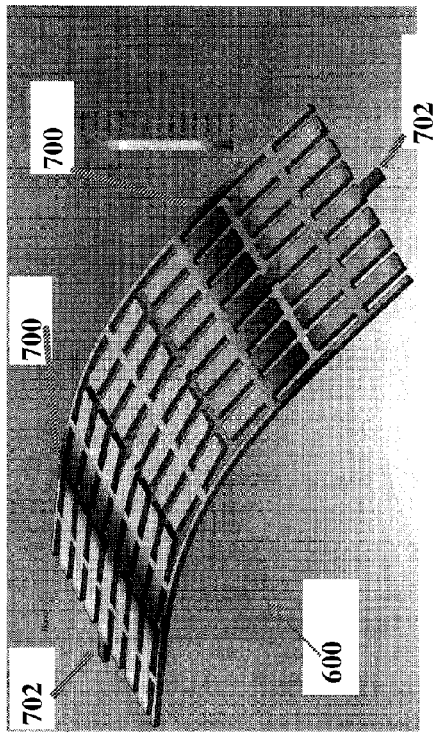
FIG. 7 illustrates how the third level might vibrate.

FIG. 7 illustrates the fundamental mode of the third level 600. The fundamental frequency response of the third level hierarchy 600 in this example is 2.5 MHz. Note that this response also results in some areas 700 that are displaced less than other areas 702.

Figure 8:
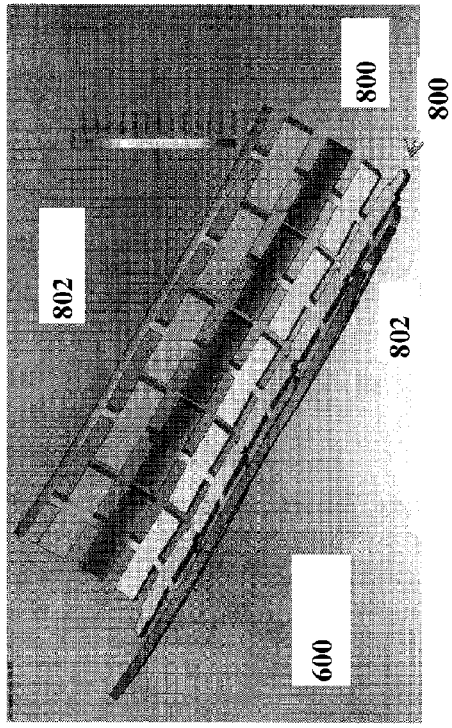
FIG. 8 illustrates an alternate form of vibration for the third level.

FIG. 8 illustrates the collective mode of the second level elements (referenced in FIG. 5). The collective frequency response of the second level elements in this example is 17 MHz. Note that this response is similar to the fundamental mode of the second level elements as illustrated in FIG. 4. In addition, this response also results in some areas 800 that are displaced less than other areas 802.

Figure 9:
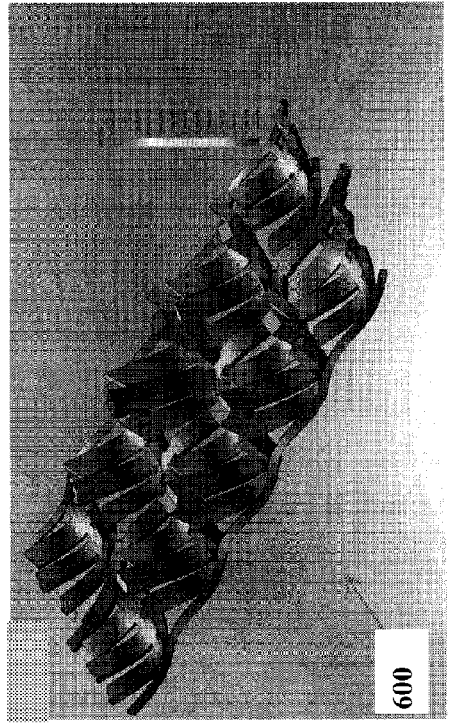
FIG. 9 illustrates another alternate form of vibration for the third level.

FIG. 9 illustrates the collective mode of the first level elements (referenced in FIG. 1). The collective frequency response of the first level elements in this example is 169 MHz. Again, note that this response is similar to the fundamental mode of the first level elements as illustrated in FIG. 2. Moreover, although not as clear in this figure, this response also results in some areas that are displaced more than other areas.

Figure 10:
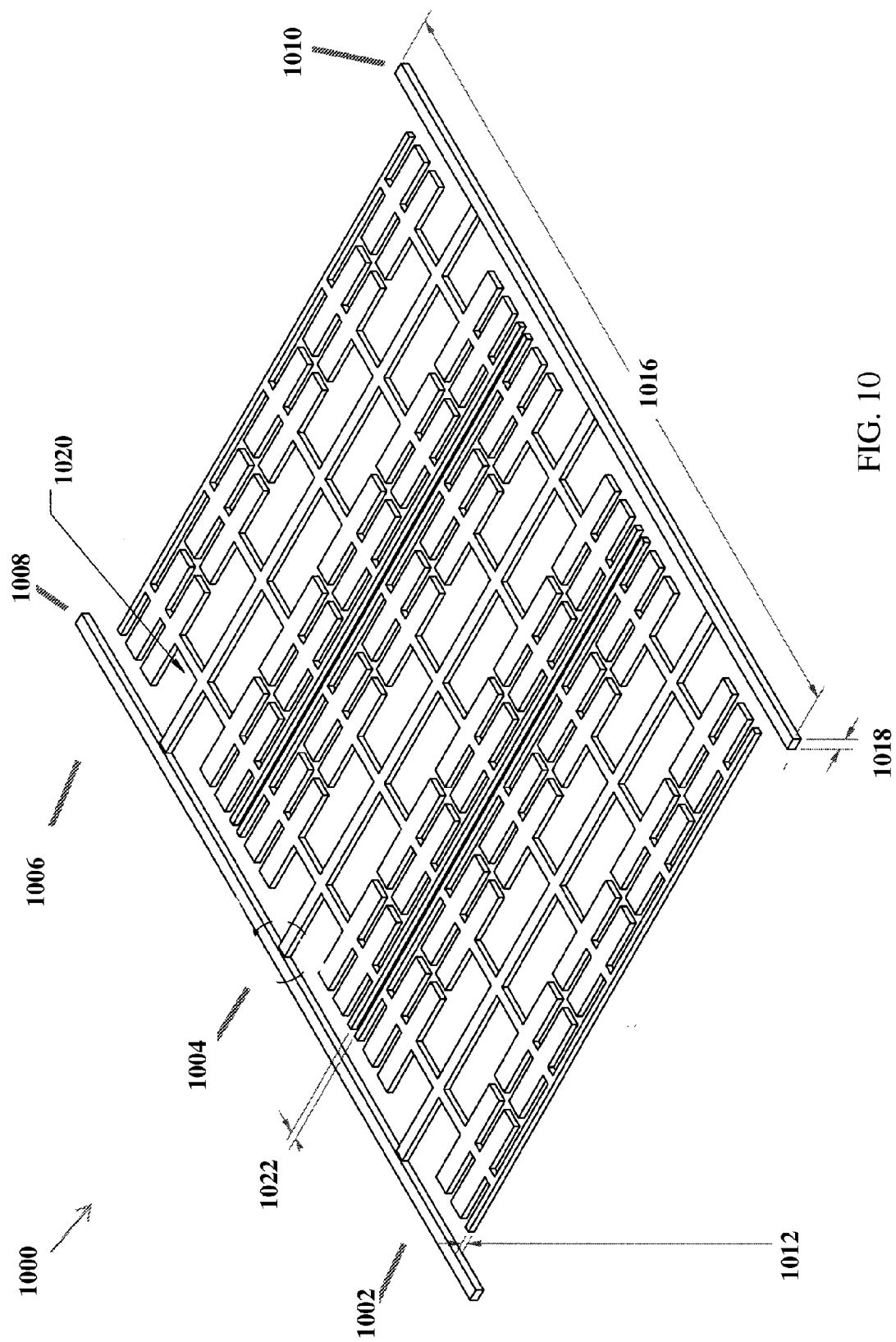
FIG. 10 illustrates a set of third level structures that form a forth level.

FIG. 10 illustrates a fourth level hierarchy 1000. In this example, three third level elements 1002, 1004, and 1006 (with the underlying second and first level elements) are used to generate the fourth level hierarchy 1000 at a different length scale. In this example, both coupling elements 1008 and 1010 have a thickness 1012 of 400 nm while the rest of the structure has a thickness of 300 nm. Furthermore, the length 1016 of the coupling elements 1008 and 1010 is 40000 nm while the width 1018 is 600 nm in this example. For the sake of simplifying the illustration, note that the inner three first level elements 1020 from the third level elements have been omitted. Additionally, the spacing 1022 between the third level elements 1002, 1004 and 1006 is 400 nm in this example. Moreover, the exact placement of the coupling elements 1008 and 1010 creates "resonance matching condition" or "resonance impeding condition" depending on whether the acoustic wave of the hierarchical resonance frequency generated at level zero is allowed along horizontal or the vertical direction. Further, although not shown, the fourth level 1000 is anchored at the four ends (zero displacement boundary condition) as would be the case in a typical device.

Figure 11:
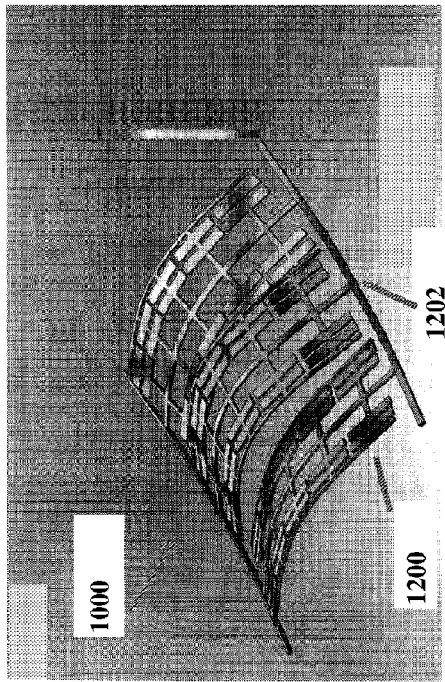
FIG. 11 illustrates how the forth level structure might vibrate.

FIG. 11 illustrates the fundamental mode of the fourth level 1000. The fundamental frequency response of the fourth level hierarchy 1000 in this example is 1.2 MHz. Note that this response also results in some areas 1000 and 1102 that are displaced more than other areas 1100.

Figure 12:
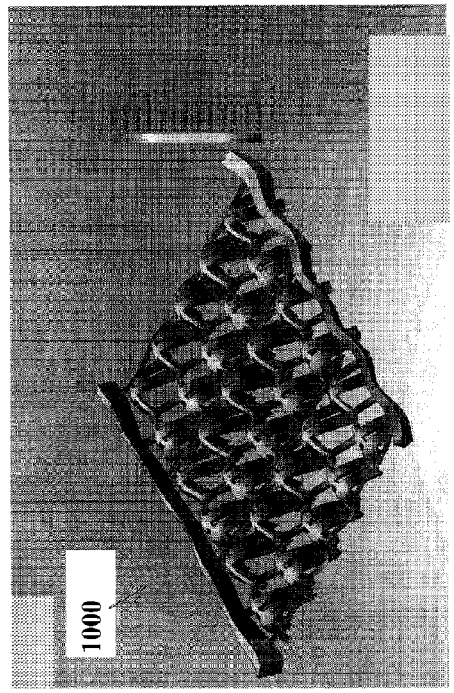
FIG. 12 illustrates an alternate form of vibration of the fourth level structure.

FIG. 12 illustrates the collective mode of the third level elements (referenced in FIG. 6). The collective frequency response of the second level elements in this example is 2.0 MHz. In addition, this response also results in some areas 1200 that are displaced less than other areas 1202.

Figure 13:
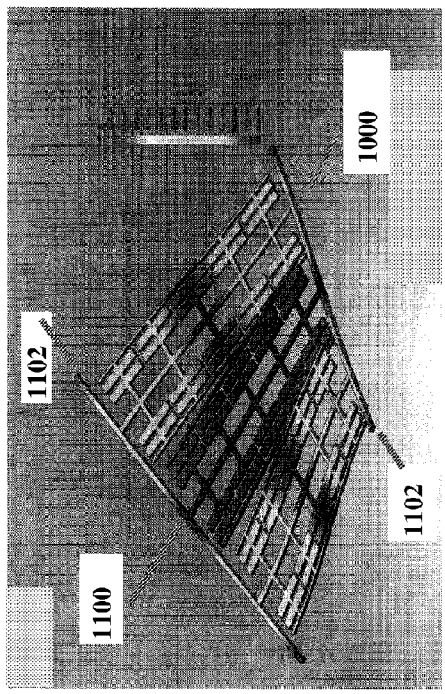
FIG. 13 illustrates another alternate form of vibration of the forth level structure.

FIG. 13 illustrates the collective mode of the second level elements (referenced in FIG. 5). The collective frequency response of the second level elements in this example is 19 MHz. Further, although not as clear in this figure, this response also results in some areas that are displaced more than other areas.

Figure 14:
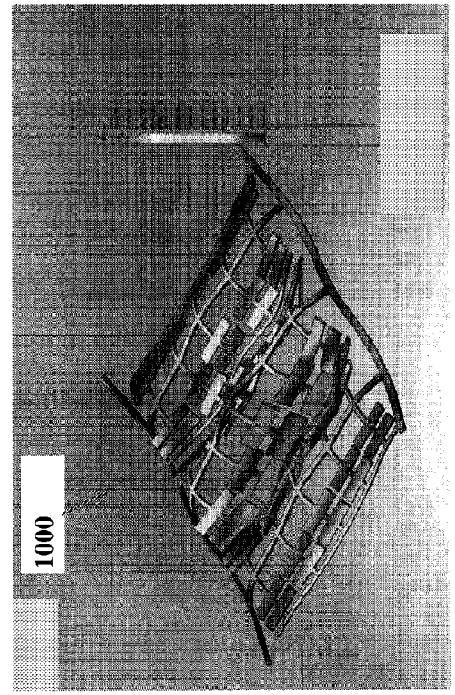
FIG. 14 illustrates yet another form of vibration of the forth level structure.

FIG. 14 illustrates the collective mode of the first level elements (referenced in FIG. 1). The collective frequency response of the first level elements in this example is 169 MHz. Again, note that this response is similar to the fundamental mode of the first level elements as illustrated in FIG. 2. Additionally, while this response also results in some areas that are displaced more than other areas the detail is not shown for the sake of simplifying the figure.

These last embodiments illustrate a fundamental aspect of this hierarchical design in that it is possible to create displacement or motion of a much larger length scale (~the scale of the final hierarchy or the entire device size) at a resonance frequency determined by the smallest length scale. The efficiency of this mechanism is increased if the number of elements in the lower level is much larger than that of the next higher level. Although only four levels of a hierarchy are shown in the previous embodiments, a person of ordinary skill in the art would realize that more levels of hierarchy are in the spirit of the present invention.

FIG. 15 illustrates an alternate second level hierarchy 1500. In this embodiment, the first level elements 1502 are connected by two beams 1504. Otherwise, this alternate second level hierarchy is similar to the second level hierarchy 310 of FIG. 3. The dimensions of the first level elements are: width 1506 of 1000 nm and length 1508 of 5500 nm. The dimensions of the two beams are: thickness 1510 of 300 nm, width 1512 of 150 nm, while the length 1514 of extension from the elements 1502 is 2000 nm. In addition, the length 1516 from the beginning of one first level element to another is 1500 nm.

FIG. 16 illustrates a collective frequency response mode of the first level elements for the alternate second level hierarchy 1500. In this example, the collective frequency response is 165 MHz. Note that this location of the two beams is in the areas 1600 that are minimally displaced.

Figure 17:
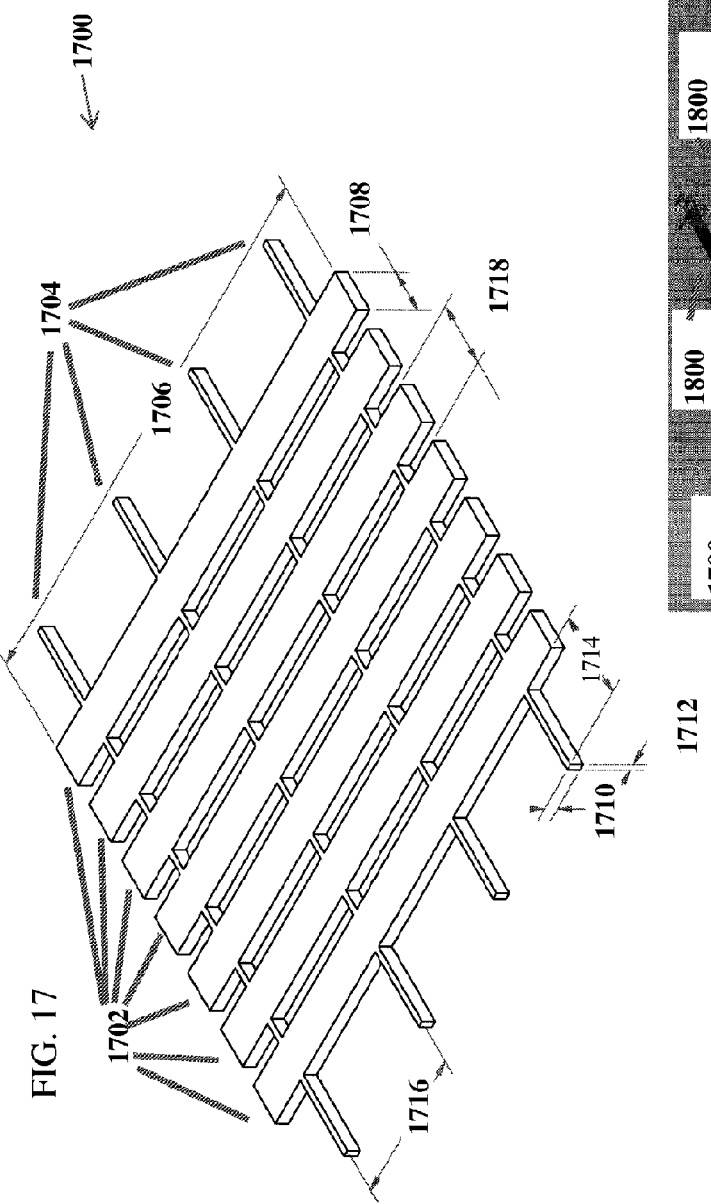
FIG. 17 illustrates a set of alternate second level structures to form an alternate third level.

FIG. 17 illustrates another alternate second level hierarchy 1700. In this embodiment, seven first level elements 1702 are connected by four beams 1704. The dimensions of the first level elements are: length 1706 of 12786 nm, width 1708 of 1000 nm. The dimensions of the four beams are: thickness 1710 of 300 nm, width 1712 of 150 nm, and the length 1714 of extension from the elements 1702 is 2000 nm. Moreover, the length 1718 from the beginning of one first level element to another is 1500 nm.

Figure 18:
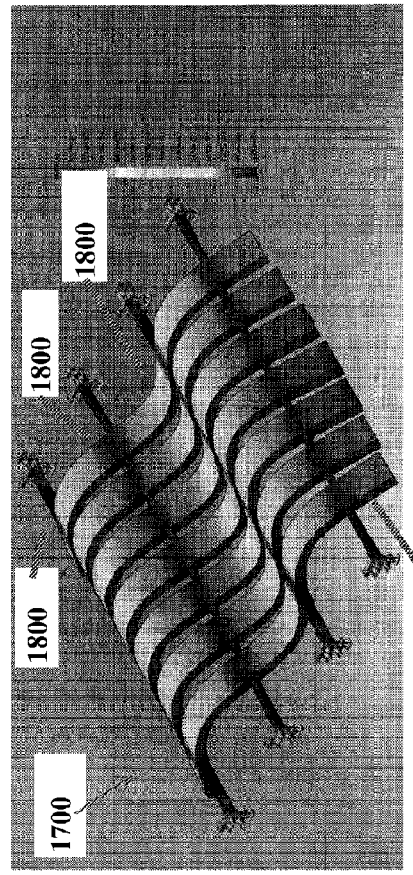
FIG. 18 illustrates how the alternate third level structure might vibrate.

FIG. 18 illustrates a collective frequency response mode of the first level elements for the alternate second level hierarchy 1500. In this example, the collective frequency response is also 165 MHz although the first level elements of this embodiment are longer than the first level elements of FIG. 15. Note that this location of the four beams is in the areas 1800 that are minimally displaced.

Figure 19:
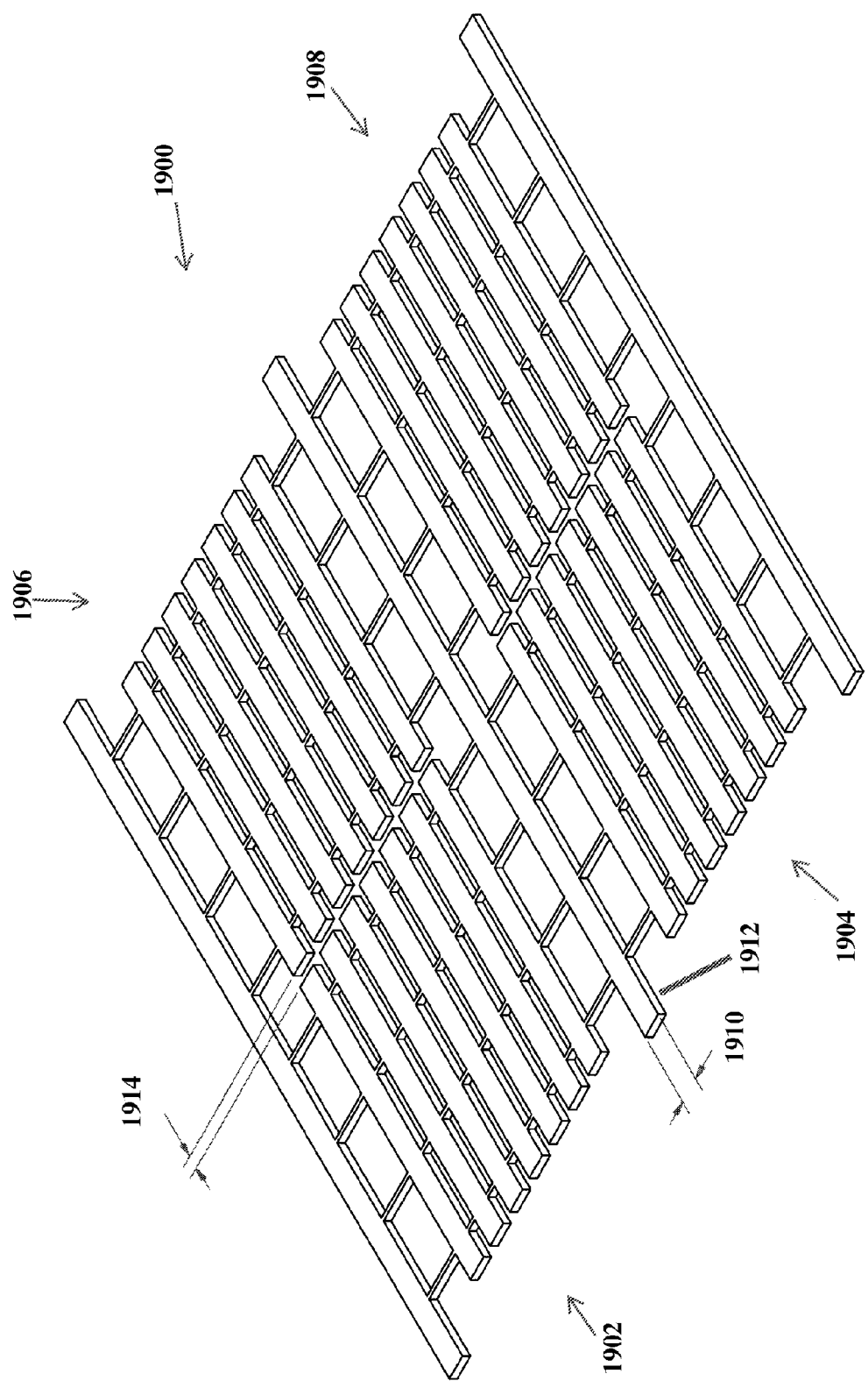
FIG. 19 illustrates a set of alternate third level structures to form an alternate fourth level structure.

FIG. 19 illustrates an alternate third level hierarchy 1900. In this example, four second level elements 1902, 1904, 1906, and 1908 (with the underlying first level elements) are used to generate the third level hierarchy 1900 at a different length scale. In this example, the width 1910 of central beam 1912 is 1000 nm. In addition, the length 1914 between the second level elements is 500 nm.

Figure 20:
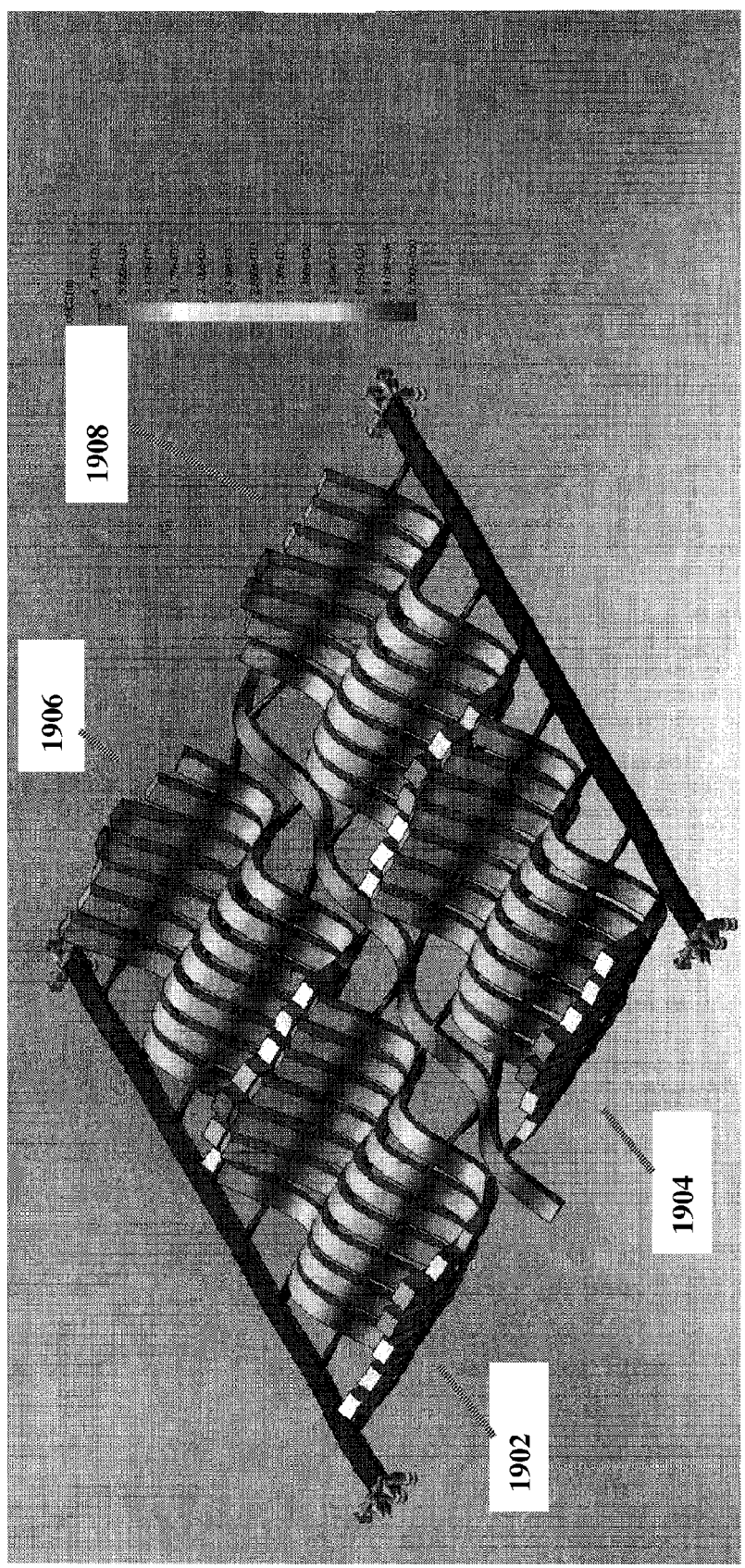
FIG. 20 illustrates how the alternate fourth level structure might vibrate.

FIG. 20 illustrates a collective frequency response mode of the first level elements for the alternate third level hierarchy 1900. In this example, the collective frequency response is 165.63 MHz. Note that this location of the four beams in each second level element 1902, 1904, 1906 and 1908 are in the areas that are minimally displaced.

Figure 21:
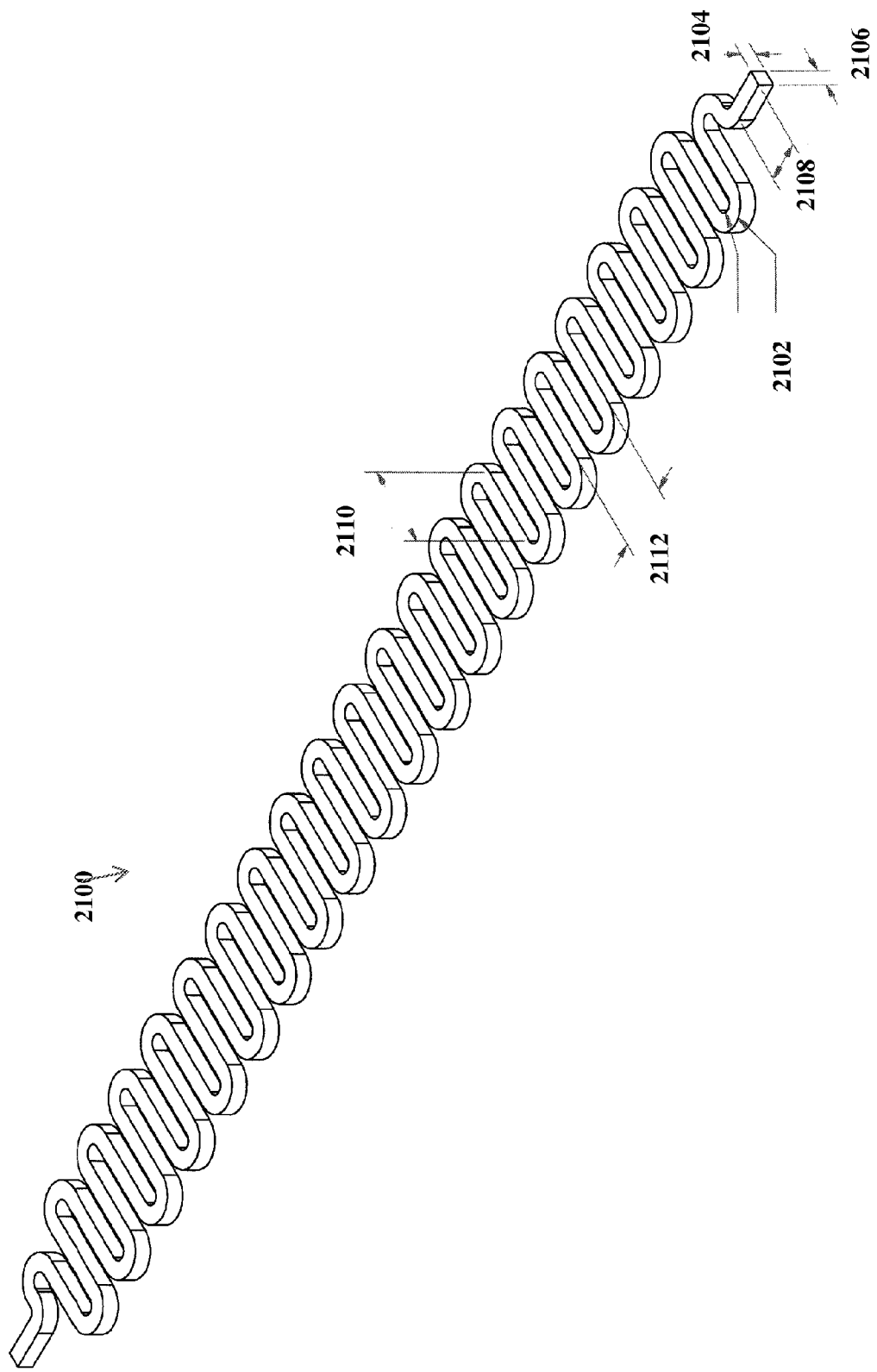
FIG. 21 illustrates an alternate form of first level structures that form a second level serpentine structure.

FIG. 21 illustrates an alternate form of first level structures that form a second level serpentine structure 2100. In this example, the straight portions between the curved portions 2102 of the serpentine structure 2100 act similar to the first level elements in the previous embodiments. In this embodiment, the serpentine structure 2100 has dimensions of: width 2104 of 200 nm and thickness 2106 of 185 nm while the extension length 2108 from curving portions is 500 nm. In addition, the length 2110 from the beginning of one curve to the beginning of another curve in the same direction is 1000 nm, while the length 2112 from one curve to another is 800 nm. Moreover, in this embodiment, the cross sectional area throughout the serpentine structure should remain constant in order to achieve mechanical impedance matching to prevent reflection of waves and reduce the number of nodes in the resonance modes of the serpentine structure 2100.

Figure 22:
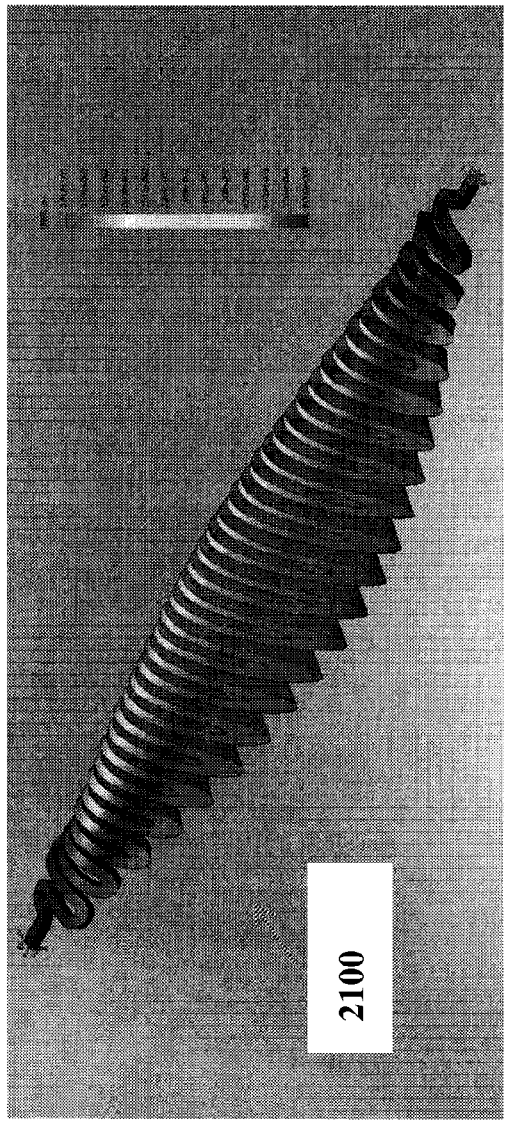
FIG. 22 illustrates how an alternate form of second level serpentine structure might vibrate.

FIG. 22 illustrates a collective frequency response mode of the first level elements for the serpentine structure 2100. In this example, the collective frequency response is 606 MHz.

Figures 23, 24:
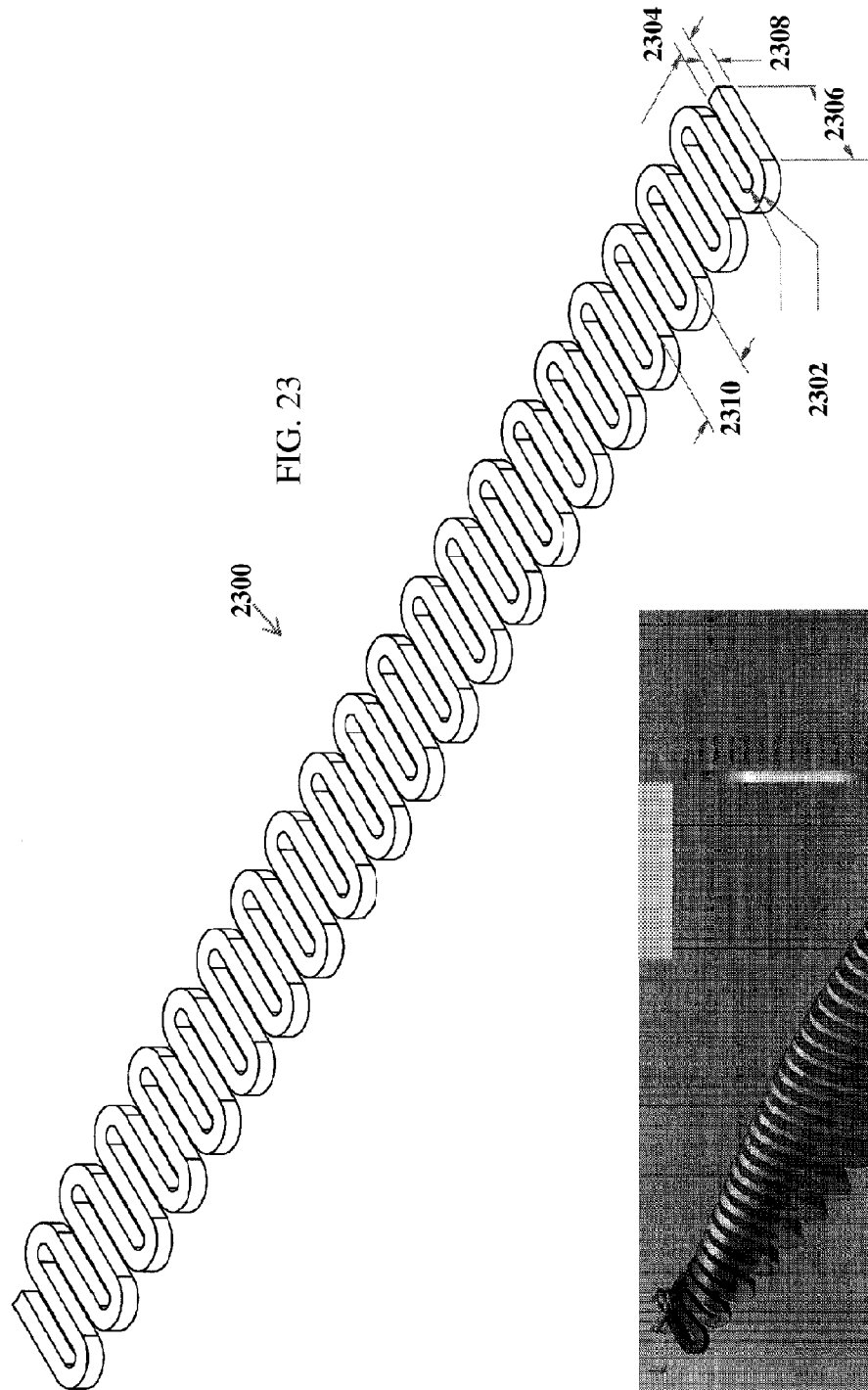
FIG. 23 illustrates an alternate embodiment of a second level serpentine structure.
FIG. 24 illustrates how the alternate embodiment of the second level serpentine structure might vibrate.

FIG. 23 illustrates an alternate form the second level serpentine structure 2300. In this example, the segments between the curved portions 2302 of the serpentine structure 2300 act similar to the first level elements in the earlier embodiments. In this embodiment, the serpentine structure 2300 has dimensions of: width 2304 of 200 nm and thickness 2308 of 185 nm while the length 2306 from the first curving portion is 1000 nm. In addition, the length 2310 from the beginning of one curve to the beginning of another curve in the same direction is 800 nm. Since this serpentine structure 2300 does not have an extension from the curved portions as the previous serpentine structure, this serpentine structure is anchored differently.

FIG. 24 illustrates a collective frequency response mode of the first level elements for the serpentine structure 2300. In this example, the collective frequency response is also about 606 MHz although anchored differently than serpentine structure 2100.

Figure 25:
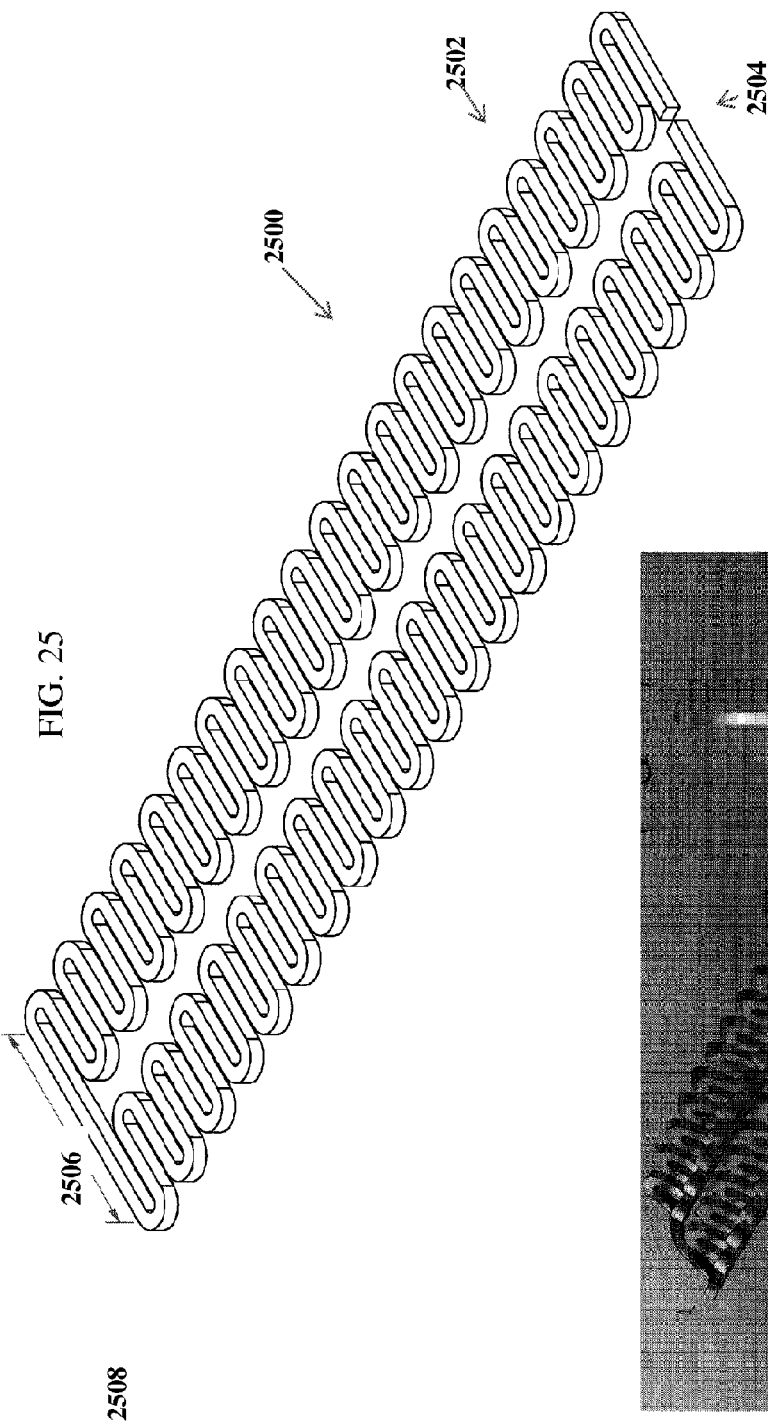
FIG. 25 illustrates a set of second level serpentine structures that form a third level.

FIG. 25 illustrates a third level of hierarchy 2500. This third level 2500 includes two second level serpentine structures 2500, and 2502. The two serpentine structures 2500 and 2502 are connected together by a coupling element 2508. In this example, the length 2506 of coupling element 2508 is 3045 nm. This length of a coupling element has been found to have a low order frequency mode that matches the collective modes of the serpentine structures 2500, and 2502. In addition, tuning the length 2506 of the coupling element 2508 obtains a combined collective mode for this third level structure 2500.

Figure 26:
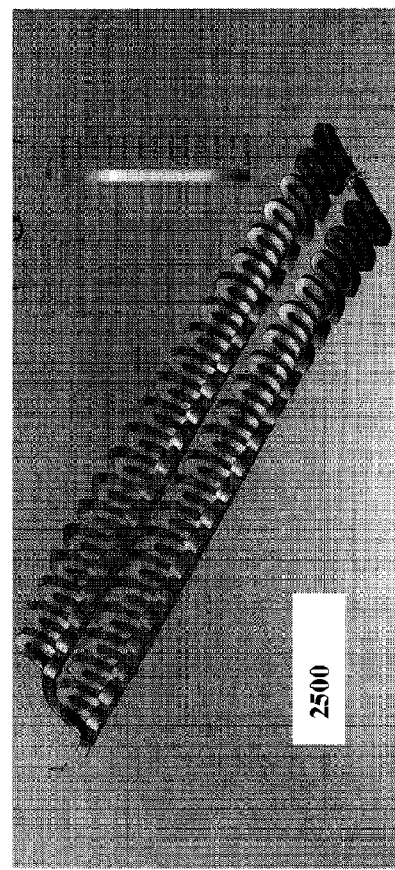
FIG. 26 illustrates how a third level serpentine structure might vibrate.

FIG. 26 illustrates a collective frequency response mode of the first level elements for the third level hierarchy 2500. In this example, the collective frequency response is also 606 MHz.

Figure 27:
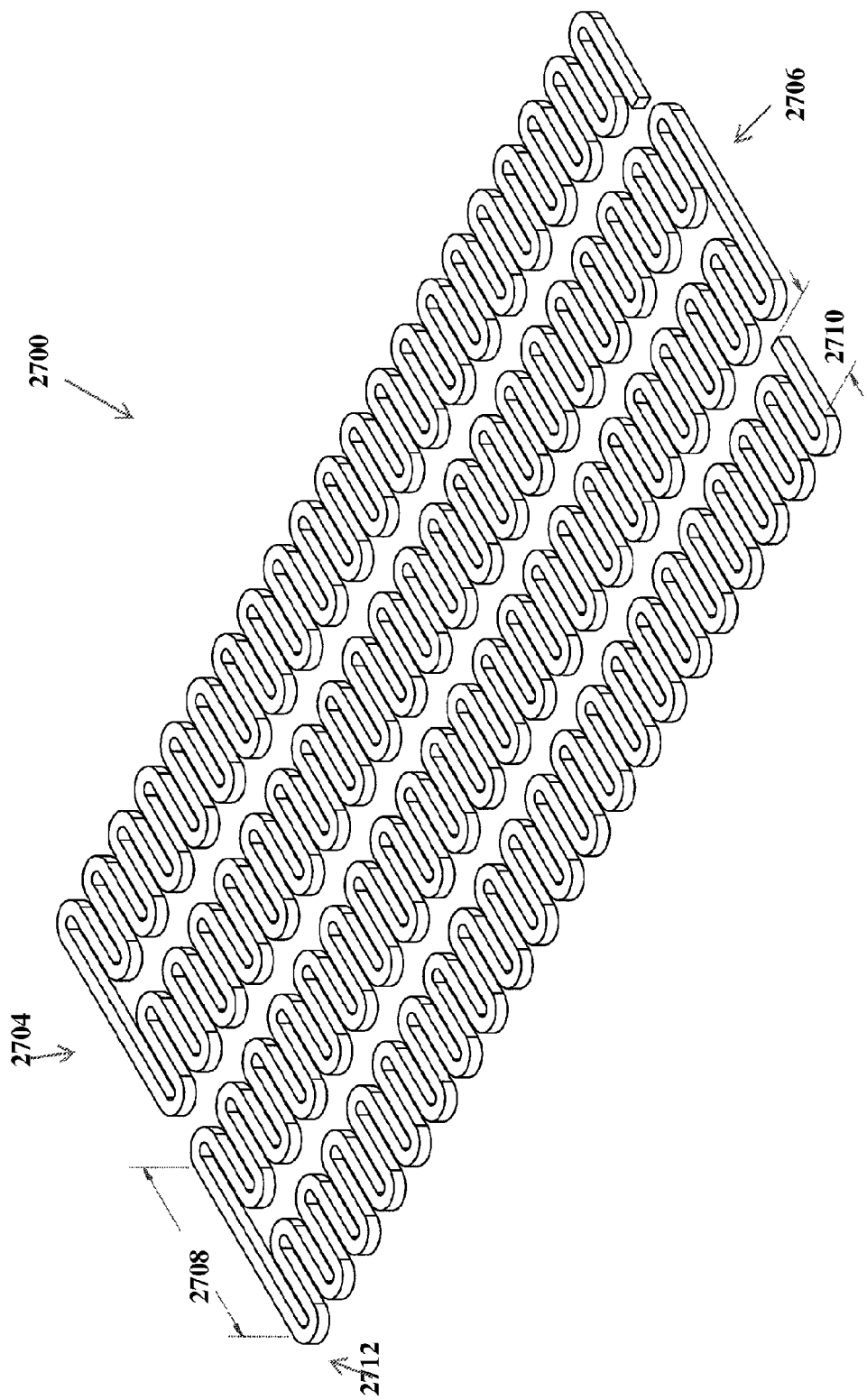
FIG. 27 illustrates a set of third level serpentine structures that form a fourth level.

FIG. 27 illustrates an alternate third level of hierarchy 2700. This third level 2700 includes four second level serpentine structures. The four serpentine structures are connected together by a three coupling elements 2702, 2704 and 2706. In this example, the length 2708 of coupling element 2702 is 3045 nm, and is the same as the length of the other coupling elements 2704 and 2706. As in the previous embodiment, the length of the coupling elements have been found to have a low order frequency mode that matches the collective modes of the serpentine structures.

Figure 28:
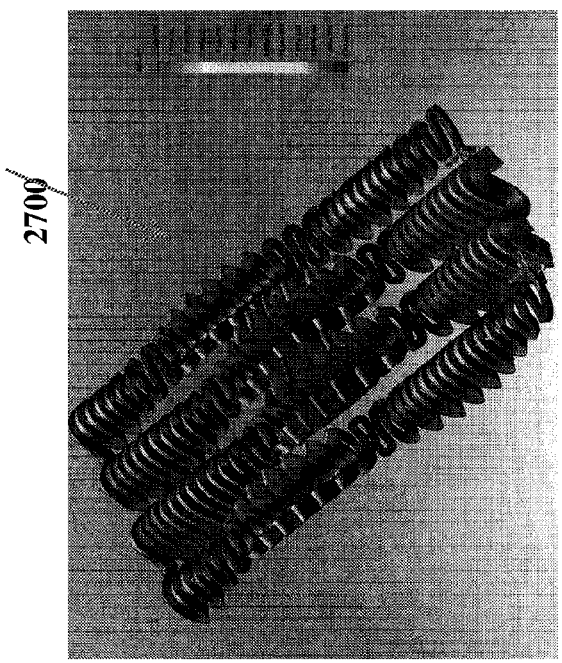
FIG. 28 illustrates how a fourth level serpentine structure might vibrate.

FIG. 28 illustrates a collective frequency response mode of the first level elements) for the third level hierarchy 2700. In this example, the collective frequency response is about 603 MHz.

Figure 29:
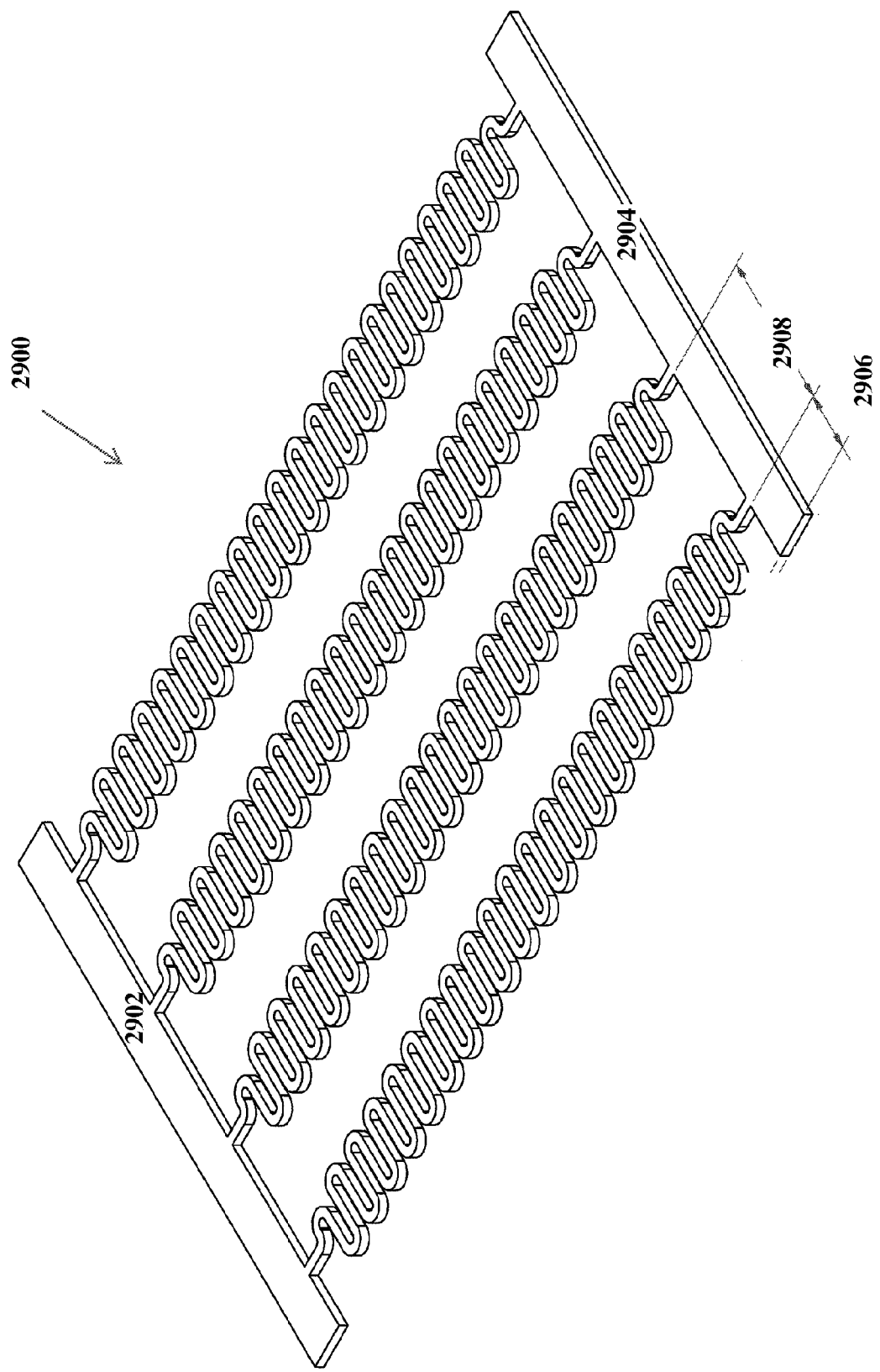
FIG. 29 illustrates another set of second level serpentine structures that form an alternate third level structure.

FIG. 29 illustrates yet another alternate third level of hierarchy 2900. This third level 2900 also includes four second level serpentine structures. However, these four serpentine structures are connected together by a two coupling elements 2902, and 2904. In this example, the extension length 2906 from the last serpentine structure to the end of the coupling element 2904 is 1211 nm. Moreover, the length 2908 between serpentine structures is 3180 nm. In this embodiment, the length between serpentine structures has been found to have a low order frequency mode similar to the collective modes of the serpentine structures.

Figure 30:
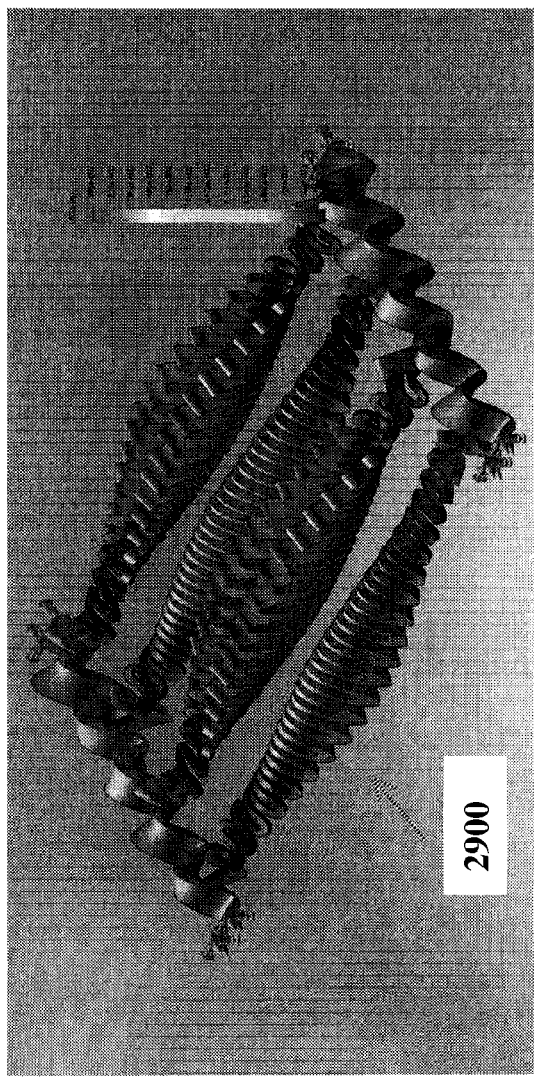
FIG. 30 illustrates how the alternate third level serpentine structure might vibrate.

FIG. 30 illustrates a collective frequency response mode of the first level elements for the third level hierarchy 2900. In this example, the collective frequency response is about 605 MHz.

Figure 31:
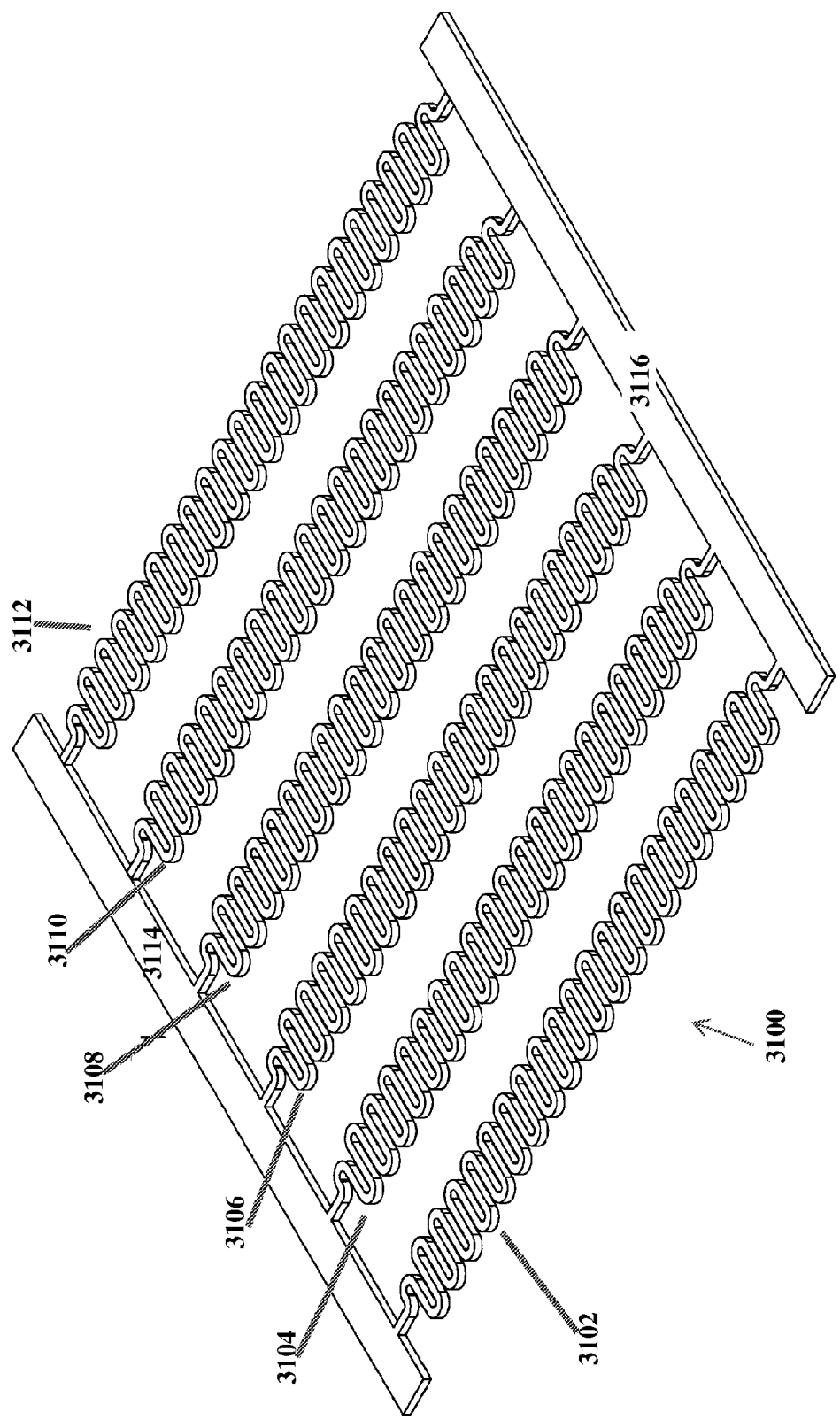
FIG. 31 illustrates yet another set of second level serpentine structures that form another alternate third level structure.

FIG. 31 illustrates yet another alternate third level of hierarchy 3100. This third level 3100 includes six second level serpentine structures 3102, 3104, 3106, 3108, 3110, and 3112. These six serpentine structures 3102, 3104, 3106, 3108, 3110, and 3112 are connected together by a two coupling elements 3114, and 3116. In this embodiment, the length between serpentine structures also has a low order frequency mode that matches/complements to the collective modes of the serpentine structures.

Figure 32:
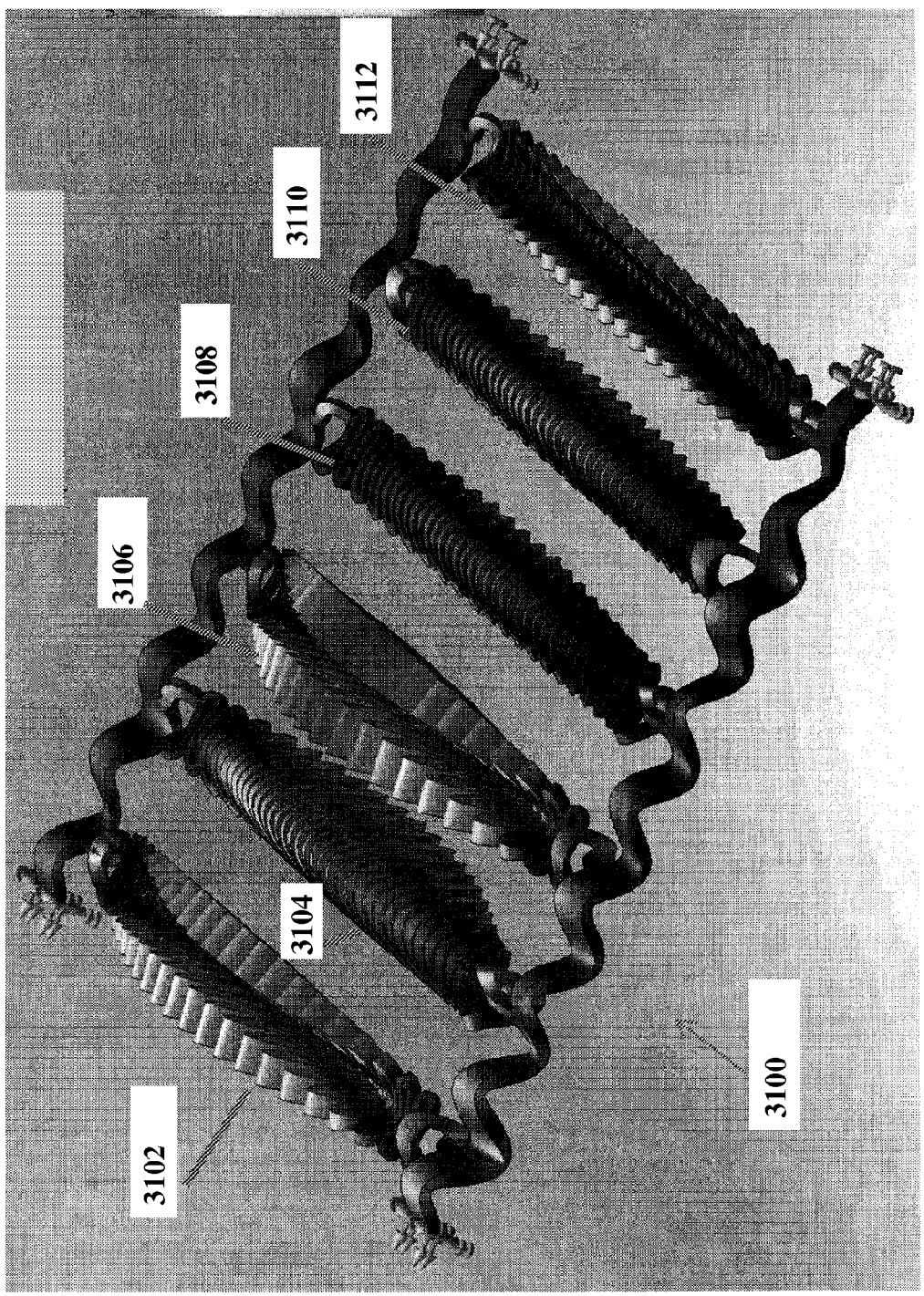
FIG. 32 illustrates how the alternate third level serpentine structure might vibrate.

FIG. 32 illustrates a collective frequency response mode of the first level elements for the third level hierarchy 3100. In this example, the collective frequency response is about 607 MHz. However, in this embodiment, serpentine structures 3102, 3106 and 3112 resonate in phase and serpentine structures 3104, 3108 and 3110 resonate 180 degrees out of phase.

While staying within the restrictions of the nature of the hierarchy of resonators of the present invention, there are still many different variations possible. These include choice of material. While silicon is still the material of choice for most integrated circuits today, other materials might also be commercially expedient. Piezoelectrics such as Aluminum Nitride (AlN) has in particular shown much promise because of its intrinsically high stiffness (yielding high frequencies), low-temperature deposition methods, and ease of actuation/detection. Other materials include, but are not limited to, metals, other piezoelectrics (PZT, quartz, MN, ZnO), CVD diamond, semiconductors (GaAs, SiGe, SiC, AlP, AlGaN, AlGaAs, GaN, InP, Si), superconducting materials, and heterostructures of all kinds (piezoelectric/semiconductor, semiconductor/metal, bimetal, etc.).

Additionally, the hierarchy of nano electromechanical resonators can be used in many types of devices. For example, the hierarchy of nano electromechanical resonators may be used in, but is not limited to, cellular phones, PDAs, personal computers, consumer electronic devices, RFID tracking devices, GPS receivers, cellular base stations, terrestrial repeaters, point-to-point or point-to-multipoint wireless transmission stations, mesh networks, wireless-enabled appliances and peripherals (printers, digital cameras, household appliances), satellite communications, FM radio, AM radio, radar communications, miniaturized communications platforms, femto cell base stations, personal area network transmission stations or terminals, satellite radio receivers (Sirius/XM), military communications platforms, interplanetary space probes, encrypted safety identification, MEMS device communication/control (e.g. biocompatible medical micro/nanobots controlled via integrated RF transceivers).

The previous description of the disclosed embodiments is provided to enable those skilled in the art to make or use the present invention. Various modifications to these embodiments will be readily apparent to those skilled in the art and generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An electromechanical resonating structure, comprising:
a first plurality of sub-micron size elements configured to resonate at a characteristic frequency and coupled to at least one first flexible structure, the first plurality of elements and the at least one first flexible structure collectively defining a first resonating structure;
a second plurality of sub-micron size elements configured to resonate at the characteristic frequency and coupled to at least one second flexible structure, the second plurality of elements and the at least one second flexible structure collectively defining a second resonating structure; and
at least one flexible support coupling the first resonating structure to the second resonating structure, the first and second resonating structures and the at least one flexible support collectively defining a third level resonating structure,
wherein the third level resonating structure is configured to resonate in at least one mode at a frequency different from the characteristic frequency and determined by a geometry and material of the first and second pluralities of elements, and is configured to resonate with an amplitude greater than amplitudes of vibration exhibited by the first and second pluralities of elements.

2. The electromechanical resonating structure of claim 1 wherein the third level resonating structure is a first third level resonating structure and is coupled to a second substantially identical third level resonating structure, the first and second third level resonating structures collectively defining a fourth level resonating structure.

3. The electromechanical resonating structure of claim 1 wherein a length of the at least one flexible support is configured to produce a low order frequency mode substantially matching a collective frequency mode of the first and second pluralities of elements.

4. A biocompatible medical robot comprising the electromechanical resonating structure of claim 1.

5. The electromechanical resonating structure of claim 1 wherein the at least one flexible support is located in one or more areas determined to optimize dampening due to the at least one flexible support.

6. The electromechanical resonating structure of claim 1 wherein at least one of the first and second resonating structures form a curved or a serpentine structure.

7. The electromechanical resonating structure of claim 1 wherein each of the first and second pluralities of elements are rectangular in shape.

8. An electromechanical resonating structure, comprising:
a first plurality of sub-micron size elements configured to resonate at a characteristic frequency and coupled to at least one first flexible structure, the first plurality of elements and the at least one first flexible structure collectively defining a first resonating structure;
a second plurality of sub-micron size elements configured to resonate at the characteristic frequency and coupled to at least one second flexible structure, the second plurality of elements and the at least one second flexible structure collectively defining a second resonating structure;
at least one flexible support coupling the first resonating structure to the second resonating structure, the first and second resonating structures and the at least one flexible support collectively defining a first third level resonating structure;
a second third level resonating structure coupled to the first third level resonating structure, the first and second third level resonating structures collectively defining a first fourth level resonating structure; and a second fourth level resonating structure coupled to the first fourth level resonating structure, wherein the first fourth level resonating structure is configured to resonate in at least one mode at a frequency different from the characteristic frequency and determined by a geometry and material of the first and second pluralities of elements, and is configured to resonate with an amplitude greater than amplitudes of vibration exhibited by the first and second pluralities of elements.

9. The electromechanical resonating structure of claim 8 wherein a geometry and material of the at least one flexible support is configured to produce a low order frequency mode substantially matching a collective frequency mode of the first and second pluralities of elements.

10. The electromechanical resonating structure of claim 8 wherein a geometry and material of a coupling element that couples the first fourth level resonating structure to the second fourth level resonating structure is configured to produce a low order frequency mode substantially matching a collective frequency mode of the first and second pluralities of elements.

11. The electromechanical resonating structure of claim 8 further including a plurality of anchors between the first plurality of sub-micron size elements and the first flexible structure configured to transduce a signal.

12. The electromechanical resonating structure of claim 11 wherein the plurality of anchors are configured to select an amplification and a directionality of the signal.

13. The electromechanical resonating structure of claim 11 wherein a size and a shape of each of the plurality of anchors are so defined that a signal transmission along any direction is allowed or inhibited.

14. The electromechanical resonating structure of claim 8 wherein the at least one flexible support is located in one or more areas determined to optimize dampening due to the at least one flexible support.

15. The electromechanical resonating structure of claim 8 wherein at least one of first and second resonating structures form a curved or a serpentine structure.

16. The electromechanical resonating structure of claim 8 wherein each of the first and second pluralities of elements are rectangular in shape.

17. An electromechanical resonating structure, comprising:

a first plurality of sub-micron size elements configured to resonate at a characteristic frequency and coupled to at least one first flexible structure, the first plurality of elements and the at least one first flexible structure collectively defining a first resonating structure;

a second plurality of sub-micron size elements configured to resonate at the characteristic frequency and coupled to at least one second flexible structure, the second plurality of elements and the at least one second flexible structure collectively defining a second resonating structure;

at least one flexible support coupling the first resonating structure to the second resonating structure, the first and second resonating structures and the at least one flexible support collectively defining a first third level resonating structure;

a second third level resonating structure coupled to the first third level resonating structure, the first and second third level resonating structures collectively defining a first fourth level resonating structure;

a second fourth level resonating structure coupled to the first fourth level resonating structure; and a plurality of anchors between the first plurality of sub-micron size elements and the first flexible structure, wherein the first fourth level resonating structure is configured to resonate in at least one mode at a frequency different from the characteristic frequency and determined by a geometry and material of the first and second pluralities of elements, and is configured to resonate with an amplitude greater than amplitudes of vibration exhibited by the first and second pluralities of elements, and wherein a length of a coupling element that couples the first fourth level resonating structure to the second fourth level resonating structure is configured to produce a low order frequency mode substantially the same as a collective frequency mode of the first and second pluralities of elements.

* * * * *